US009012900B2

(12) United States Patent
Beak et al.

(10) Patent No.: US 9,012,900 B2
(45) Date of Patent: Apr. 21, 2015

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Jung-Sun Beak, Paju-si (KR);
Jeong-Oh Kim, Goyang-si (KR);
Yong-Min Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/947,531

(22) Filed: Jul. 22, 2013

(65) Prior Publication Data
US 2014/0175393 A1 Jun. 26, 2014

(30) Foreign Application Priority Data

Dec. 26, 2012 (KR) .......................... 10-2012-0152902
May 21, 2013 (KR) .......................... 10-2013-0056911

(51) Int. Cl.
*H01L 27/32* (2006.01)
(52) U.S. Cl.
CPC ........... *H01L 27/3246* (2013.01); *H01L 27/322* (2013.01); *H01L 27/3262* (2013.01); *H01L 27/3265* (2013.01)
(58) Field of Classification Search
CPC .................................................. H01L 27/3246
USPC ........ 257/40, 49, 71, 72, 92, 98, 448; 438/29, 438/34, 155
See application file for complete search history.

(56) References Cited

U.S. PATENT DOCUMENTS

| 6,758,538 | B2 * | 7/2004 | Fujita et al. ................... 313/506 |
| 6,887,631 | B2 * | 5/2005 | Kiguchi et al. .................... 430/7 |
| 7,154,117 | B2 * | 12/2006 | Segawa et al. .................. 257/60 |
| 7,230,592 | B2 * | 6/2007 | Sato et al. ....................... 345/76 |
| 2002/0038998 | A1 | 4/2002 | Fujita et al. |
| 2002/0195604 | A1 | 12/2002 | Segawa et al. |
| 2003/0116768 | A1 | 6/2003 | Ishikawa |
| 2006/0146256 | A1 * | 7/2006 | Ahn ............................. 349/141 |

(Continued)

FOREIGN PATENT DOCUMENTS

JP 2010-152221 A 7/2010

OTHER PUBLICATIONS

Extended European Search Report issued in European Patent Application No. 13177613,0, mailed Feb. 6, 2015, 11 pages.

*Primary Examiner* — Lex Malsawma
*Assistant Examiner* — Sheng Zhu
(74) *Attorney, Agent, or Firm* — Brinks Gilson & Lione

(57) ABSTRACT

An organic light emitting diode display device capable of improving capacitance Cst of a storage capacitor and transmittance and a method of fabricating the same are disclosed. The organic light emitting diode display device includes a driving thin film transistor (TFT) formed on the substrate, a passivation film formed to cover the TFT driver, a color filter formed on the passivation film in a luminescent region, a planarization film formed to cover the color filter, a transparent metal layer formed on the planarization film, an insulating film formed on the transparent metal layer, a first electrode connected to the TFT driver and overlapping the transparent metal layer while interposing the insulating film therebetween, an organic light emitting layer and a second electrode which are sequentially formed on the first electrode. The transparent metal layer, the insulating film, and the first electrode constitute a storage capacitor in the luminescent region.

20 Claims, 12 Drawing Sheets

(56) References Cited

U.S. PATENT DOCUMENTS

2007/0103610 A1 5/2007 Lee et al.
2008/0018566 A1* 1/2008 Yamauchi et al. .............. 345/76
2011/0147757 A1* 6/2011 Kim et al. ...................... 257/71
2011/0175102 A1 7/2011 Hatano
2011/0278615 A1* 11/2011 No et al. ......................... 257/98
2012/0267670 A1 10/2012 Lee et al.

* cited by examiner

ORGANIC LIGHT EMITTING DIODE DISPLAY DEVICE AND METHOD OF FABRICATING THE SAME

This application claims priority to Korean Patent Application No. 10-2012-0152902, filed on Dec. 26, 2012 and Korean Patent Application No. 10-2013-0056911, filed on May 21, 2013, the entirety of which are hereby incorporated by reference herein.

BACKGROUND OF THE INVENTION

1. Field of the Invention

The present invention relates to an organic light emitting diode display device, and more particularly, to an organic light emitting diode display device capable of increasing a capacitance Cst of a storage capacitor and improving transmittance and a method of fabricating the same.

2. Discussion of the Related Art

For an image display device which embodies a variety of information on a screen as a core technology in advanced information and communication, there is continuous progress in development of slim, light-weight, and portable devices with improved performance. Hereupon, an organic light emitting diode display device for controlling a luminescent amount of an organic light emitting layer is recently receiving attention as a flat panel display device, along with the need for a flexible display capable of being bent pursuant to convenience and space utilization.

The organic light emitting diode display device includes a thin film transistor (TFT) array part formed on a substrate, an organic light emitting display panel disposed on the TFT array part, and an encapsulation layer for isolating the organic light emitting display panel from the outside. The organic light emitting diode display device applies an electric field to a first electrode and a second electrode formed at both ends of an organic light emitting layer so as to inject and transfer electrons and holes into the organic light emitting layer, thereby utilizing an electroluminescence phenomenon which emits light as energy released through recombination of the electrons and holes. The electrons and holes, which are paired with each other in the organic light emitting layer, emit light when falling from an excited state to a ground state.

In detail, in the organic light emitting diode display device, a plurality of sub-pixels is defined by intersections of a plurality of gate lines and a plurality of data lines. Each of the sub-pixels receives a data signal from the data line when a gate pulse is supplied to the gate line, thereby generating light corresponding to the data signal.

Meanwhile, the organic light emitting diode display device includes a storage capacitor formed in a non-luminescent region. However, as a storage region in which the storage capacitor is formed increases in size to increase a capacitance Cst of the storage capacitor, an aperture ratio of the display device is reduced.

SUMMARY OF THE INVENTION

Accordingly, the present invention is directed to an organic light emitting diode display device and a method of fabricating the same that substantially obviate one or more problems due to limitations and disadvantages of the related art.

An object of the present invention is to provide an organic light emitting diode display device having a sufficient capacitance Cst without reducing an aperture ratio by forming a storage capacitor in a luminescent region of an organic light emitting diode, and a method of fabricating the same.

According to an aspect of the present invention, an organic light emitting diode display device is provided comprising: a substrate having a luminescent region; a thin film transistor driver deposited on the substrate; a passivation film deposited to cover the thin film transistor driver; a color filter deposited on the passivation film in the luminescent region; a planarization film deposited to overlap the color filter; a transparent metal layer deposited on the planarization film to overlap the luminescent region; an insulating film deposited on the transparent metal layer; a first electrode connected to the thin film transistor driver and overlapping the transparent metal layer, wherein the insulating film is interposed between the first electrode and the transparent metal layer and overlaps the luminescent region; an organic light emitting layer deposited on the first electrode and configured to emit light through the luminescent region; and a second electrode deposited on the organic light emitting layer.

According to another aspect of the present invention, a method of fabricating an organic light emitting diode display device is provided, the method comprising: forming a thin film transistor driver on a substrate having a luminescent region; forming a passivation film on the substrate to cover the thin film transistor driver; forming a color filter on the passivation film to correspond to the luminescent region; forming a planarization film to cover the color filter; forming a transparent metal layer on the planarization film to overlap with the luminescent region; forming an insulating film on the transparent metal layer; forming a first electrode to connect with the thin film transistor driver and overlap the transparent metal layer, wherein the insulating film is interposed between the first electrode and the transparent metal layer and overlaps with the luminescent region; forming an organic light emitting layer on the first electrode, wherein light is emitted from the organic light emitting layer and through the luminescent region; and forming a second electrode on the organic light emitting layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting diode display device according to the present invention and a method of fabricating the same will be described with reference to the accompanying drawings.

Figure 1:
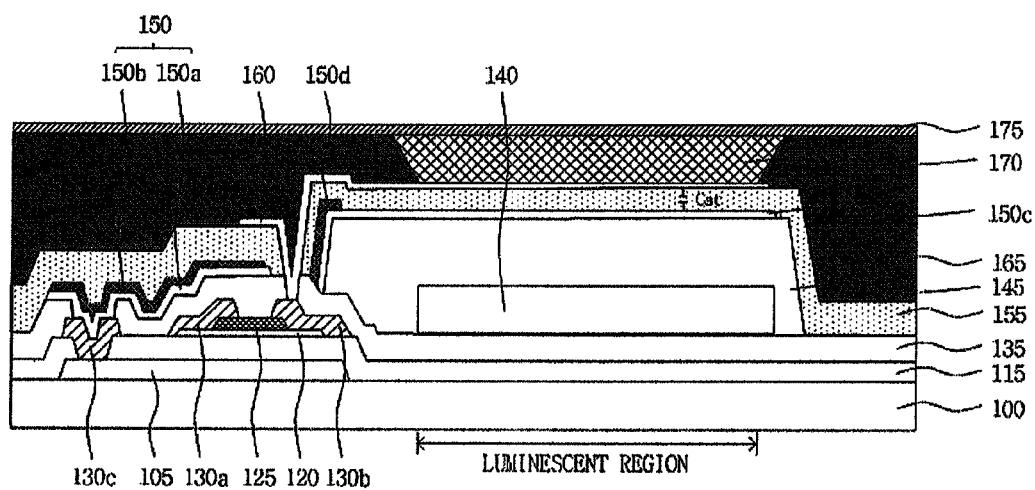
FIG. 1 is a cross-sectional view illustrating an organic light emitting diode display device according to the present invention.

FIG. 1 is a cross-sectional view illustrating an organic light emitting diode display device according to the present invention.

As illustrated in FIG. 1, the organic light emitting diode display device according to the present invention includes a substrate 100 having a luminescent region, a driving thin film transistor (TFT) formed on the substrate 100, a passivation film 135 formed to cover the TFT driver, a color filter 140 formed on the passivation film 135 in the luminescent region, a planarization film 145 formed to cover the color filter 140, a transparent metal layer 150c formed on the planarization film 145 within the luminescent region, a light blocking layer 150d formed on the transparent metal layer 150c to cover sides of the planarization film 145, an insulating film 155 formed over the substrate 100 to cover the transparent metal layer 150c and the light blocking layer 150d, and an organic light emitting diode connected to the TFT driver. The organic light emitting diode includes a first electrode 160, which is overlaps the transparent metal layer 150c while interposing the insulating film 155 therebetween, an organic light emitting layer 170 formed on the first electrode 160, and a second electrode 175 formed on the organic light emitting layer 170. In this regard, the transparent metal layer 150c, the insulating film 155, and the first electrode 160 constitute a storage capacitor.

Particularly, a plurality of sub-pixels is defined by intersections of gate lines (not shown) and data lines (not shown) disposed on the substrate 100. A switching thin film transistor (TFT) (not shown) and the TFT driver are formed at each of the intersections of the gate lines (not shown) and data lines (not shown). In this regard, the switching TFT (not shown) and the TFT driver are connected to each other via a connection portion 130c. Particularly, a drain electrode of the switching TFT (not shown) is connected to a gate electrode 105 of the TFT driver via a first gate contact hole formed by selectively removing a gate insulating film 115.

The TFT driver illustrated herein is an oxide TFT using an oxide such as Indium gallium zinc oxide (IGZO), zinc oxide (ZnO), and titanium oxide (TiO) as a semiconductor layer 120. However, an organic TFT using an organic material as the semiconductor layer 120, an amorphous silicon TFT using amorphous silicon as the semiconductor layer 120, and a polysilicon TFT using polysilicon as the semiconductor layer 120 may also be applied thereto.

The TFT driver includes the gate electrode 105, which protrudes from the gate line (not shown) or is defined as a part of the gate line (not shown), the gate insulating film 115 to cover the gate electrode 105, the semiconductor layer 120 formed on the gate insulating film 115 to overlap the gate electrode 105, an etch stop layer (ESL) 125 formed on the semiconductor layer 120, and a source electrode 130a formed on the etch stop layer 125 and connected to the data line (not shown) and a drain electrode 130b formed on the etch stop layer 125 to be spaced apart from the source electrode 130a. The connection portion 130c is formed of the same material as the source electrode 130a and drain electrode 130b.

The passivation film 135 is formed to cover the TFT driver using an inorganic insulating material such as $SiO_x$, $SiN_x$, and $Al_2O_3$. The color filter 140 is formed on the passivation film 135. The color filter 140 is formed at a luminescent region of each sub-pixel. Light emitted from the organic light emitting diode passes through the color filter 140 to be emitted to the outside via the substrate 100.

The planarization film 145 is formed to cover the color filter 140. The planarization film 145 is formed to cover only the color filter 140. Accordingly, a double gate electrode 150 that is connected to the gate electrode 105 via the connection portion 130c is prepared. Also a light blocking layer 150d is formed at a side of the planarization film 145.

Particularly, the transparent metal layer 150c is formed on the planarization film 145 to correspond to the luminescent region, and the light blocking layer 150d is formed on the transparent metal layer 150c to surround a side of the planarization film 145. The transparent metal layer 150c is formed of a transparent conductive material such as tin oxide (TO), indium tin oxide (ITO), indium zinc oxide (IZO), and indium tin zinc oxide (ITZO).

The transparent metal layer 150c, the first electrode 160 connected to the drain electrodes 130a of the TFT driver, and the insulating film 155 interposed therebetween constitute a storage capacitor to form a capacitance Cst. The light blocking layer 150d is formed of an opaque material such as silver (Ag), aluminum (Al), chromium (Cr), molybdenum (Mo), tungsten (W), titanium (Ti), and thallium (Ta) to prevent incidence of light emitted from the organic light emitting diode upon the TFT driver.

The double gate electrode 150 has a structure in which a transparent conductive pattern 150a formed in the same layer as the transparent metal layer 150c and an opaque conductive pattern 150b formed in the same layer as the light blocking layer 150d are sequentially laminated. The double gate electrode 150 is connected to the connection portion 130c via a second gate contact hole (not shown) that exposes the connection portion 130c by selectively removing the passivation film 135.

The double gate electrode 150 improves performance of the TFT driver and prevents light emitted from the organic light emitting diode from entering the TFT driver in the same manner as the light blocking layer 150d.

The insulating film 155 is formed over the substrate 100 to cover the double gate electrode 150, the transparent metal layer 150c, and the light blocking layer 150d. The first electrode 160 is formed on the insulating film 155 in the luminescent region to overlap the transparent metal layer 150c.

The first electrode 160 is formed of the transparent conductive material as described above and is connected to the drain electrode 130b via a drain contact hole (not shown) formed by selectively removing the insulating film 155 and the passivation film 135. In this regard, since the first electrode 160 overlaps the transparent metal layer 150c while interposing the insulating film 155 therebetween, a capacitance Cst is formed in the luminescent region of the organic light emitting diode display device.

That is, a storage region is not additionally prepared to form a storage capacitor by forming the storage capacitor in the luminescent region. Accordingly, as the capacitance Cst increases, the aperture ratio increases by about 20 to 25% in comparison to conventional organic light emitting diode display devices including an additional storage region.

A bank insulating film 165 having a bank hole that exposes a portion of the first electrode 160 corresponding to the luminescent region is formed on the insulating film 155. The organic light emitting layer 170 is formed in the bank hole, and the second electrode 175 is formed on the organic light emitting layer 170. The second electrode 175 constituting a cathode is formed of a reflective metallic material such as aluminum (Al) and reflects light generated in the organic light emitting layer 170 toward the first electrode 160.

The bank insulating film 165 is a non-transparent material. The bank insulating film 165 prevents light emitted from the organic light emitting layer 170 from entering the TFT driver.

In particular, the first electrode 160 is formed of a transparent conductive material such as tin oxide (TO), indium tin oxide (ITO), indium zinc oxide (IZO), and indium tin zinc oxide (ITZO). However, the transparent conductive material is vulnerable to the short wavelength of the light.

Therefore, the non-transparent material is formed of Novolac Resins. Novolac Resins turn red at high temperature. Therefore, the long wavelength red light through the bank insulating film 165 and short wavelength green and blue light is absorbed in the bank insulating film 165.

That is, in the organic light emitting diode display device according to the present invention, the storage capacitor is configured in the luminescent region by overlapping the first electrode 160 and the transparent metal layer 150c while interposing the insulating film 155 therebetween. Accordingly, there is no need to prepare an additional storage region to form the storage capacitor, thereby increasing the aperture ratio. Accordingly, the capacitance Cst is more than twice that of conventional organic light emitting diode display devices.

Hereinafter, a method of fabricating an organic light emitting diode display device according to the present invention will be described.

FIGS. 2A to 2M are cross-sectional views illustrating a method of fabricating an organic light emitting diode display device according to the present invention.

Figure 2A:
FIGS. 2A to 2M are cross-sectional views illustrating a method of fabricating an organic light emitting diode display device according to the present invention.

As illustrated in FIG. 2A, gate lines (not shown) and a gate electrode 105 are formed on a substrate 100. A gate insulating film 115 is formed over the substrate 100 to cover the gate lines (not shown) and the gate electrode 105 using an inorganic insulating material such as $SiO_x$, $SiN_x$, and $Al_2O_3$.

Figure 2B:
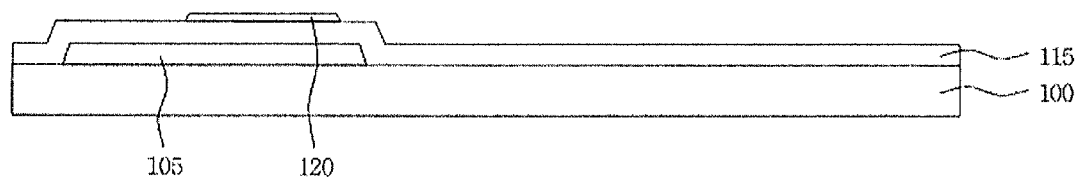

Then, as illustrated in FIG. 2B, a semiconductor layer 120 is formed to overlap the gate electrode 105 while interposing a gate insulating film 115 therebetween. The semiconductor layer 120 is formed of a material selected from the group consisting of amorphous silicon, an oxide such as indium gallium zinc oxide (IGZO), zinc oxide (ZnO), and titanium oxide (TiO), an organic material, and polysilicon.

Figure 2C:
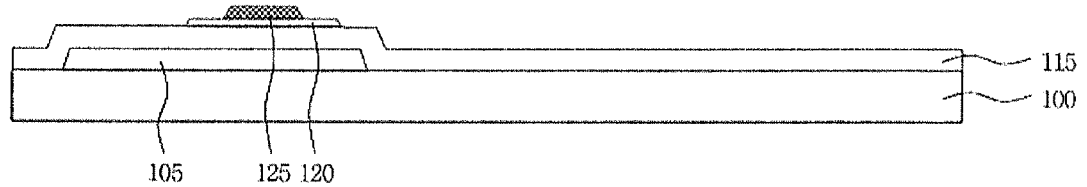

When the semiconductor layer 120 is formed of an oxide, an etch stop layer (ESL) 125 is formed on the semiconductor layer 120 as illustrated in FIG. 2C. The ESL 125 is formed of a material such as $SiO_x$ and $SiN_x$ to protect the semiconductor layer 120 while patterning source and drain electrodes which will be described later.

Figure 2D:
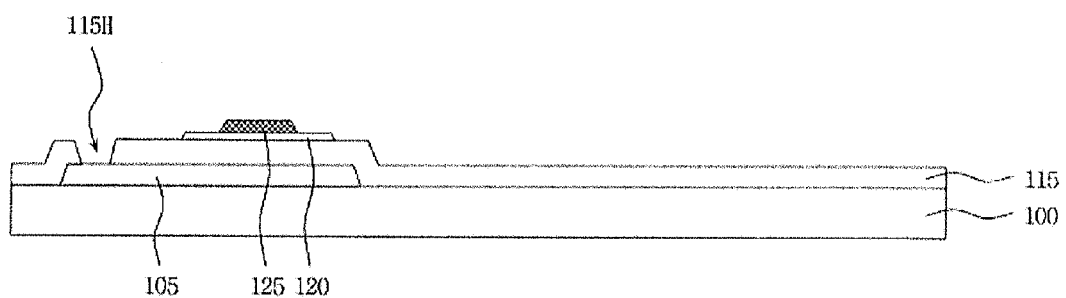

As illustrated in FIG. 2D, the gate insulating film 115 is selectively removed to form a gate contact hole 115H that exposes the gate electrode 105. The first gate contact hole 115H is formed to connect to a drain electrode of a switching TFT (not shown) and the gate electrode 105 of the TFT driver.

Figure 2E:
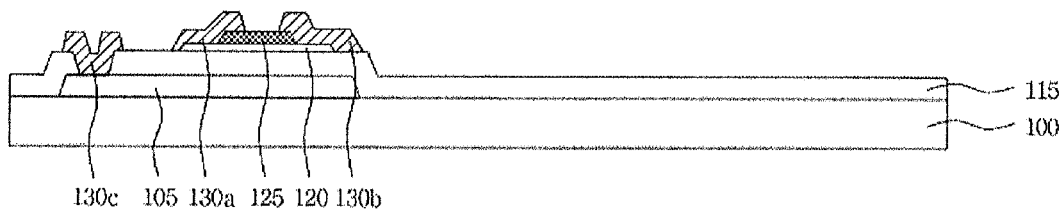

As illustrated in FIG. 2E, a data metal layer is formed over the substrate 100 having the first gate contact hole 115H and patterned to form data lines (not shown), which intersect the gate lines (not shown) while interposing the gate insulating layer 115 therebetween to define pixel regions and source and drain electrodes 130a and 130b overlapping the gate electrode 105. In addition, a connection portion 130c that connects the drain electrode of the switching TFT (not shown) with the gate electrode 105 is formed.

Figure 2F:
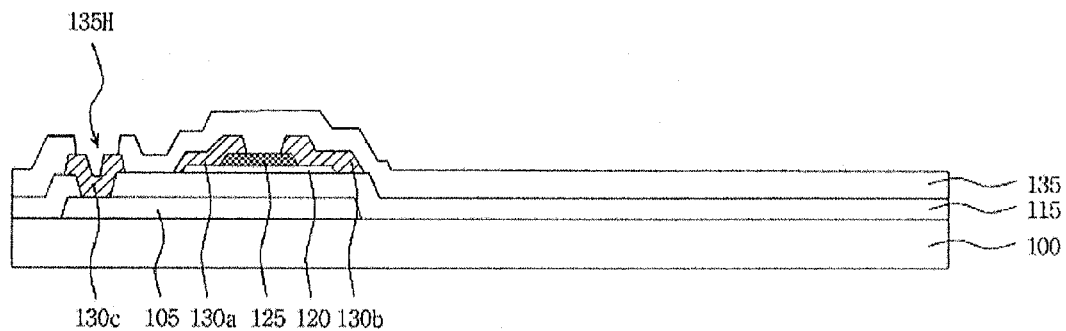

Then, as illustrated in FIG. 2F, a passivation film 135 is formed over the substrate to cover the TFT driver. The passivation film 135 has a second gate contact hole 135H that exposes the connection portion 130c.

Figure 2G:
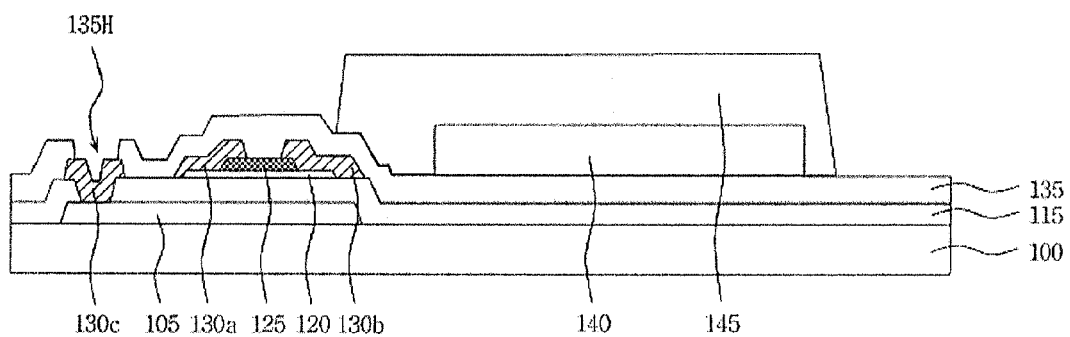

As illustrated in FIG. 2G, a color filter 140 is formed on the passivation film 135. The color filter 140 is formed at each pixel region. Then, a planarization film 145 is formed over the passivation film 135 to cover the color filter 140. The planarization film 145 is formed to cover only the color filter 140.

Figure 2H:
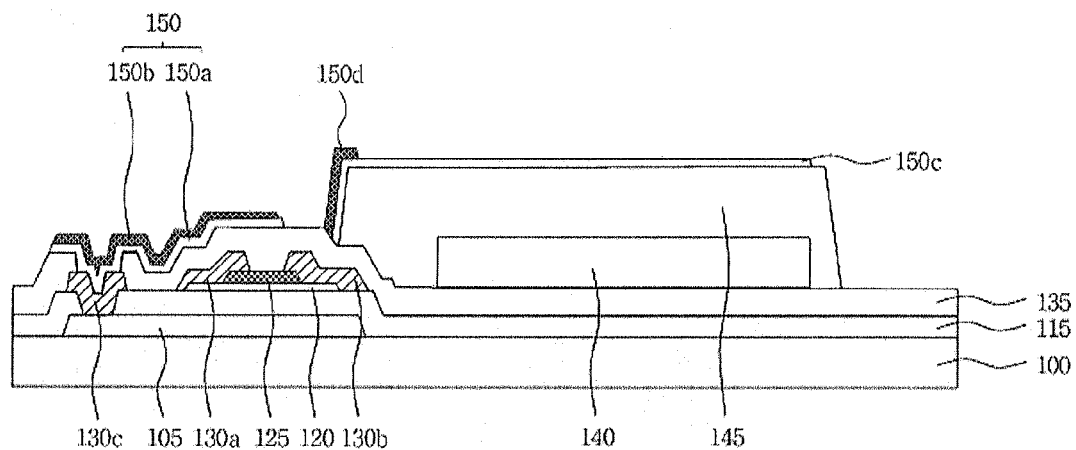

Particularly, as illustrated in FIG. 2H, a transparent conductive material such as tin oxide (TO), indium tin oxide (ITO), indium zinc oxide (IZO), and indium tin zinc oxide (ITZO) and an opaque conductive material such as silver (Ag), aluminum (Al), chromium (Cr), molybdenum (Mo), tungsten (W), titanium (Ti), and thallium (Ta) are sequentially laminated over the substrate 100 provided with the planarization film 145.

Then, photolithography is performed using a halftone mask to form the transparent metal layer 150c formed on the planarization film 145, the light blocking layer 150d formed on the transparent metal layer 150c to cover a side of the planarization film 145, and the double gate electrode 150 including a transparent conductive pattern 150a formed in the same layer as the transparent metal layer 150c and an opaque conductive pattern 150b formed in the same layer as the light blocking layer 150d. The double gate electrode is connected to the gate electrode 105 via the connection portion 130c.

The transparent metal layer 150c, the first electrode 160 of the organic light emitting diode, and the insulating film 155 interposed therebetween constitute a storage capacitor to form a capacitance Cst. In addition, the light blocking layer 150d prevents incidence of light emitted from the organic light emitting diode upon the TFT driver. The double gate electrode 150 improves performance of the TFT driver and prevents light emitted from the organic light emitting diode from entering the TFT driver in the same manner as the light blocking layer 150d.

Figure 2I:
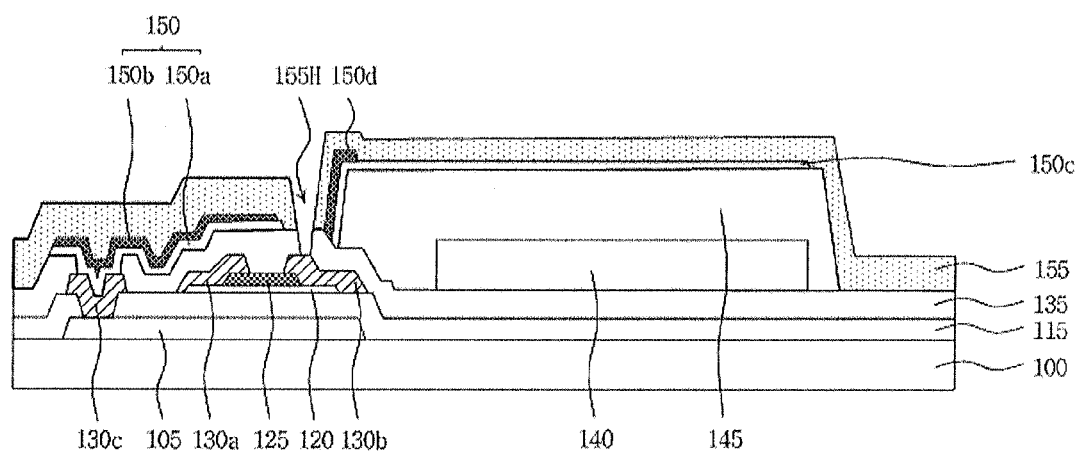

Then, as illustrated in FIG. 2I, the insulating film 155 is formed over the substrate 100 to cover the double gate electrode 150, the transparent metal layer 150c, and the light blocking layer 150d. Then, the insulating film 155 and the passivation film 135 are selectively removed to expose the drain electrode 130b of the TFT driver to form a drain contact hole 155H.

Figure 2J:
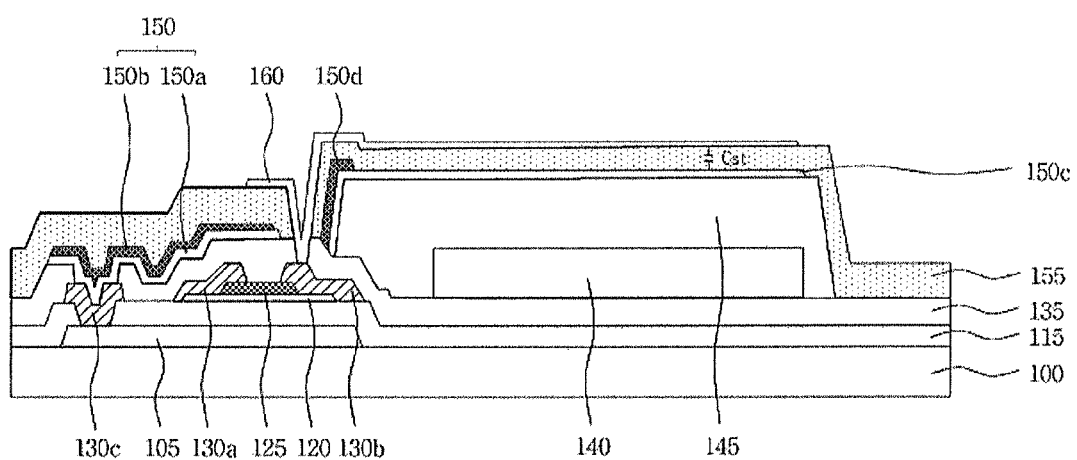

Then, as illustrated in FIG. 2J, a transparent conductive material such as tin oxide (TO), indium tin oxide (ITO), indium zinc oxide (IZO), and indium tin zinc oxide (ITZO) are formed over the insulating film 155 having the drain contact hole 155H. The transparent conductive material is patterned to form the first electrode 160 connected to the drain electrode 130b via the drain contact hole 155H. In this regard, since the first electrode 160 overlaps the transparent metal layer 150c while interposing the insulating film 155 therebetween, a capacitance Cst is formed in the luminescent region of the organic light emitting diode display device according to the present invention.

Thus, there is no need to prepare an additional storage region to form the storage capacitor in the organic light emitting diode display device according to the present invention. Thus, the organic light emitting diode display device according to the present invention has an increased aperture ratio by about 20 to 25% in comparison to conventional organic light emitting diodes including an additional storage region. Particularly, the capacitance Cst is more than twice that of conventional organic light emitting diode display devices.

Figure 2K:
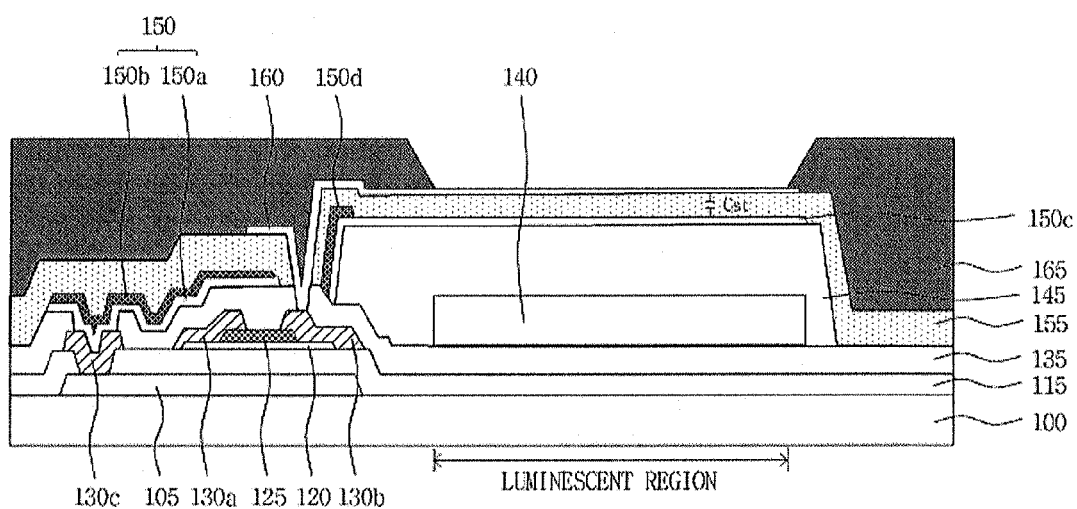
Figure 2L:
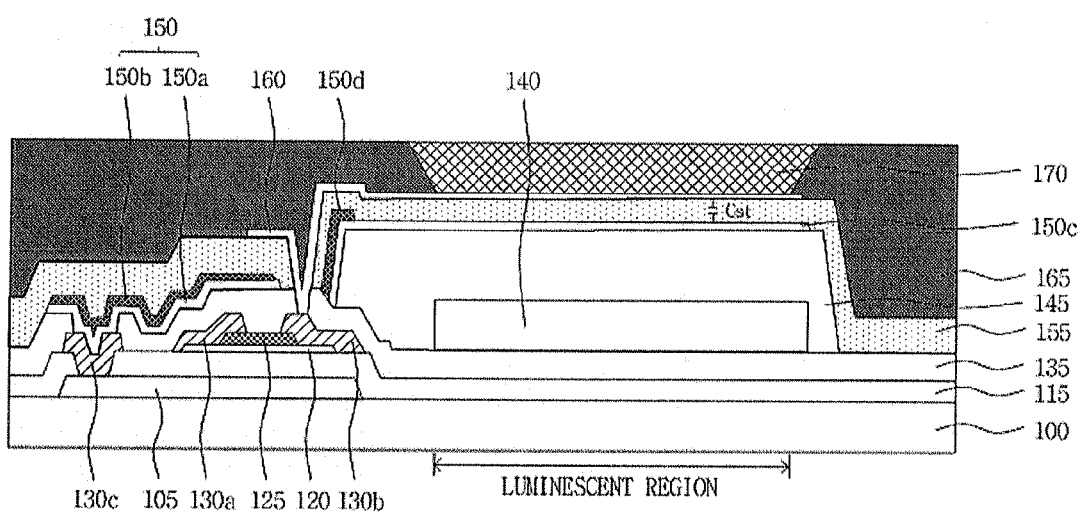

Then, as illustrated in FIG. 2K, a bank insulating film 165 having a bank hole that exposes a portion of the first electrode 160 correspond to the luminescent region is formed on the insulating film 155.

The bank insulating film 165 is a non-transparent material. The bank insulating film 165 prevents light emitted from an organic light emitting layer from entering the TFT driver.

In particular, the first electrode 160 is formed of a transparent conductive material such as tin oxide (TO), indium tin oxide (ITO), indium zinc oxide (IZO), and indium tin zinc oxide (ITZO). However, the transparent conductive material is vulnerable to the short wavelength of the light.

Therefore, the non-transparent material is formed of Novolac Resins. Novolac Resins turn red at high temperature. Therefore, the long wavelength red light through the bank insulating film 165 and short wavelength green and blue light is absorbed in the bank insulating film 165.

Then, as illustrated in FIG. 2I, the organic light emitting layer 170 is formed on the first electrode 160 exposed via the bank hole. The organic light emitting layer 170 is formed of a white organic light emitting material. Light emitted from the organic light emitting layer 170 is emitted to the outside via the substrate 100.

Figure 2M:
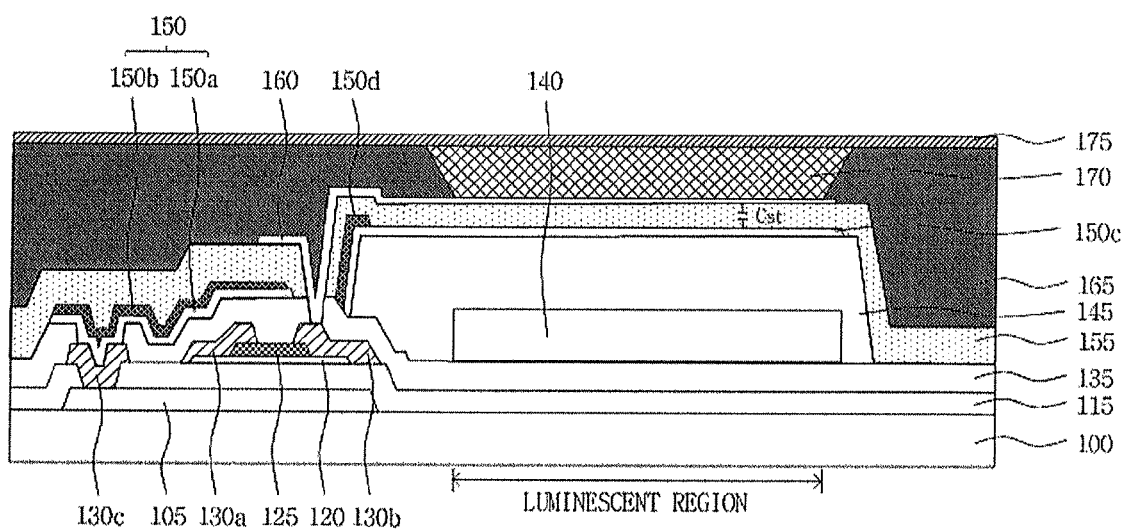

Then, as illustrated in FIG. 2M, a second electrode 175 is formed to cover the organic light emitting layer 170. The second electrode 175 constituting a cathode is formed of a reflective metallic material such as aluminum (Al) and reflects light generated in the organic light emitting layer 170 toward the substrate 100.

In this regard, light emitted from the organic light emitting layer 170 proceeds toward the first electrode 160 or toward the second electrode 175. Light proceeding toward the first electrode 160 is emitted to the outside via the first electrode 160, the insulating film 155, and the transparent metal layer 150c. Light proceeding toward the second electrode 175 is reflected by the second electrode 175 to proceed toward the first electrode 160.

Here, most of the light proceeding toward the first electrode 160, the insulating film 155, and the transparent metal layer 150c is directly emitted to the outside through the substrate 100. However, some of the light is reflected by an interface between the organic light emitting layer 170 and the first electrode 160, an interface between the first electrode 160 and the insulating film 155, and an interface between the insulating film 155 and the transparent metal layer 150c to proceed toward the second electrode 175, and is reflected by the second electrode 175 again to proceed toward the substrate 100.

Thus, the organic light emitting diode display device according to the present invention has improved light emission efficiency by constructive interference. Particularly, constructive interference occur between light, which is reflected by the above-described interfaces to proceed toward the second electrode 175 and is then reflected by the second electrode 175 to proceed toward the substrate, and light, which is emitted from the organic light emitting layer 170, proceeds toward the second electrode 175, and is then reflected by the second electrode 175 by adjusting the thicknesses of the first electrode 160, the insulating film 155, and the transparent metal layer 150c.

Figure 3A:
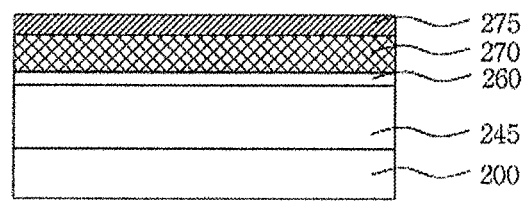
FIG. 3A is a schematic cross-sectional view illustrating a conventional organic light emitting diode display device.
Figure 3B:
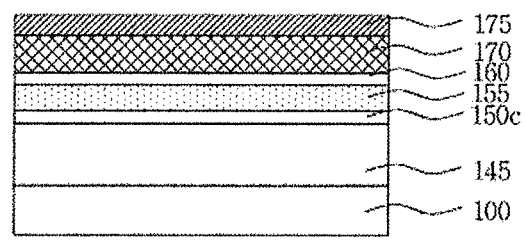
FIG. 3B is a schematic cross-sectional view illustrating an organic light emitting diode display device according to the present invention.

FIG. 3A is a schematic cross-sectional view illustrating an organic light emitting diode display device. FIG. 3B is a schematic cross-sectional view illustrating an organic light emitting diode display device according to the present invention.

As illustrated in FIG. 3A, an organic light emitting diode display device includes a substrate 200 and a planarization layer 245, a first electrode 260, an organic light emitting layer 270, and a second electrode 275 which are sequentially formed on the substrate 200. In this regard, light emitted from the organic light emitting layer 270 is emitted to the outside after travelling along a first path where the light is directly emitted via the first electrode 260, a second path where the light is reflected by an interface between the first electrode 260 and the organic light emitting layer 270 to proceed toward the second electrode 275 and reflected by the second electrode again to be emitted to the outside, or a third path where the light is reflected by the second electrode 275 and then emitted via the substrate 200.

On the other hand, as illustrated in FIG. 3B, the organic light emitting diode display device according to the preset invention includes a substrate 100 and a planarization layer 145, a transparent metal layer 150c, an insulating film 155, a first electrode 160, an organic light emitting layer 170, and a second electrode 175 which are sequentially formed on the substrate 100. Thus, in the organic light emitting diode display device according to the present invention, light may be partially reflected not only at an interface between the first electrode 160 and the organic light emitting layer 170, but also at an interface between the first electrode 160 and the insulating film 155 and an interface between the insulating film 155 and the transparent metal layer 150c so as to proceed toward the second electrode 175.

That is, the organic light emitting diode display device according to the present invention further includes the insulating film 155 and the transparent metal layer 150c between the organic light emitting layer 170 and the planarization film 145 when compared to conventional organic light emitting diode display devices. Thus, constructive interference occurs between light, which is reflected by the above-described interfaces to proceed toward the second electrode 175 and is then reflected by the second electrode 175 again to proceed toward the substrate 100, and light, which is emitted from the organic light emitting layer 170, proceeds toward the second electrode 175, and is reflected by the second electrode 175. As a result, light emission efficiency is improved by constructive interference.

Figure 4:
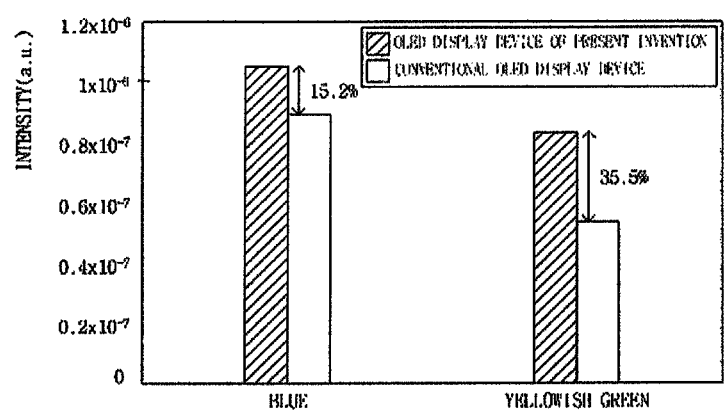
FIG. 4 is a graph illustrating intensities of light emitted from a conventional organic light emitting diode display device and light emitted from an organic light emitting diode display device according to the present invention.

FIG. 4 is a graph illustrating intensities of light emitted from a conventional organic light emitting diode display device and light emitted from an organic light emitting diode display device according to the present invention.

The conventional organic light emitting diode display device illustrated in FIG. 4 includes only a first electrode having a thickness of 500 Å and formed between a planarization film and an organic light emitting layer using indium tin oxide (ITO). The organic light emitting diode display device according to the present invention illustrated in FIG. 4 includes a transparent metal layer and a first electrode having a thickness of 500 Å and formed of indium tin oxide (ITO), and an insulating film having a thickness of 2500 Å and formed of silicon dioxide ($SiO_2$) between a planarization film and an organic light emitting layer.

That is, since the organic light emitting diode display, device according to the present invention further includes the insulating film 155 and the transparent metal layer 150c between the organic light emitting layer 170 and the planarization film 145, constructive interference occurs among light emitted to the outside via the substrate 100 after travelling a variety of paths, thereby improving light emission efficiency. As illustrated in FIG. 4, when the organic light emitting diode display device according to the present invention emits blue light, light intensity is greater than that of the conventional organic light emitting diode display device by 15.2%. In addition, when the organic light emitting diode display device according to the present invention emits yellowish green light, light intensity is greater than that of the conventional organic light emitting diode display device by 35.5%.

As described above, in the organic light emitting diode display device according to the present invention, the storage capacitor is formed in the luminescent region by overlapping the first electrode 160 and the transparent metal layer 150c while interposing the insulating film 155 therebetween. Thus, there is no need to prepare an additional storage region to form the storage capacitor, thereby improving aperture ratio. In this regard, the total thickness of the first electrode 160 and the transparent metal layer 150c is 500 Å, and the thickness of the insulating film 155 may be in the range of 500 Å to 4000 Å. Furthermore, the capacitance Cst is increased since a storage region having an area corresponding to the luminescent region is obtained.

As is apparent from the above description, the organic light emitting diode display device according to the present invention has the following effects.

First, conventional organic light emitting diodes need to have an additional storage region, and the storage region is generally disposed in a non-luminescent region. Accordingly, as the storage region increases in size, a luminescent region decreases in size. On the other hand, in the organic light emitting diode display device according to the present invention, the first electrode of the organic light emitting diode overlaps the transparent metal layer while interposing the insulating film therebetween in the luminescent region. Thus, the transparent metal layer, the insulating film, and the first electrode constitute a storage capacitor to form a capacitance Cst in the luminescent region.

Accordingly, there is no need to prepare an additional storage region to form the storage capacitor in the organic light emitting diode display device according to the present invention. Thus, the organic light emitting diode display device according to the present invention has an aperture ratio greater than that of a conventional organic light emitting diode display device by about 20% to 25%.

Second, since the organic light emitting diode display device according to the present invention includes the storage region having an area corresponding to the luminescent region, the capacitance Cst is more than twice that of a conventional organic light emitting diode display device.

Third, light emission efficiency is improved by constructive interference between light emitted through the first electrode, the insulating film, and the transparent metal layer and light reflected by the second electrode, among light emitted from the organic light emitting layer.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. An organic light emitting diode display device comprising:
   a substrate having a luminescent region;
   a thin film transistor driver on the substrate;
   a passivation film to cover the thin film transistor driver;
   a color filter on the passivation film in the luminescent region;
   a planarization film to overlap the color filter;
   a transparent metal layer on the planarization film to overlap the luminescent region;
   an insulating film on the transparent metal layer;
   a first electrode connected to the thin film transistor driver and overlapping the transparent metal layer, wherein the insulating film is interposed between the first electrode and the transparent metal layer to comprise a storage capacitor;
   a bank layer having a bank hole that exposes a portion of the first electrode on the first electrode and the insulating film;
   an organic light emitting layer on the first electrode and configured to emit light through the luminescent region; and
   a second electrode on the organic light emitting layer,
   wherein the organic light emitting layer in the luminescent region is fully overlapped with the first electrode and the transparent metal layer.

2. The organic light emitting diode display device according to claim 1, wherein the thin film transistor driver is comprised of a gate electrode coupled to a double gate electrode on the passivation film.

3. The organic light emitting diode display device according to claim 2, wherein the gate electrode is coupled the double gate electrode via a separate connection portion that is formed between the gate electrode and the double gate electrode.

4. The organic light emitting diode display device according to claim 2, wherein the double gate electrode is comprised of a transparent conductive pattern and an opaque conductive pattern.

5. The organic light emitting diode display device according to claim 4, wherein the transparent conductive pattern is formed on a same layer as the transparent metal layer, and the transparent conductive pattern is a same material as the transparent metal layer.

6. The organic light emitting diode display device according to claim 1, further comprising a light blocking layer formed on the transparent metal layer to cover a portion of the planarization film.

7. The organic light emitting diode display device according to claim 1, wherein the organic light emitting layer is configured to emit light via the luminescent region of the substrate after the light passes through the first electrode, the insulating film, and the transparent metal layer.

8. The organic light emitting diode display device according to claim 1, wherein the storage capacitor that is formed in the luminescent region of the substrate.

9. The organic light emitting diode display device of claim 1, wherein the bank layer is a non-transparent material.

10. The organic light emitting diode display device of claim 1, wherein the total thickness of the first electrode and the transparent metal layer is 500 Å and the thickness of the insulating film is in the range of 500 Å and 4000 Å.

11. A method of fabricating an organic light emitting diode display device, the method comprising:
   forming a thin film transistor driver on a substrate having a luminescent region;
   forming a passivation film on the substrate to cover the thin film transistor driver;
   forming a color filter on the passivation film to correspond to the luminescent region;
   forming a planarization film to cover the color filter;

forming a transparent metal layer on the planarization film to overlap with the luminescent region;

forming an insulating film on the transparent metal layer;

forming a first electrode to connect with the thin film transistor driver and overlap the transparent metal layer, wherein the insulating film is interposed between the first electrode and the transparent metal layer to comprise a storage capacitor;

forming a bank layer having a bank hole that exposes a portion of the first electrode on the first electrode and the insulating film;

forming an organic light emitting layer on the first electrode, wherein light is emitted from the organic light emitting layer and through the luminescent region; and forming a second electrode on the organic light emitting layer, wherein the organic light emitting layer in the luminescent region is fully overlapped with the first electrode and the transparent metal layer.

12. The method of claim 11, further comprising forming a gate electrode comprising the thin film transistor driver, wherein the gate electrode is coupled to a double gate electrode formed on the passivation film.

13. The method of claim 12, wherein the gate electrode is coupled to the double gate electrode via a separate connection portion that is formed between the gate electrode and the double gate electrode.

14. The method of claim 12, wherein the double gate electrode is comprised of a transparent conductive pattern and an opaque conductive pattern.

15. The method of claim 14, wherein the transparent metal layer and the double gate electrode are formed by sequentially forming a transparent conductive material and an opaque conductive material over the substrate provided with the planarization film, and patterning the transparent conductive material and the opaque conductive material through photolithography using a halftone mask.

16. The method of claim 15, wherein the photolithography using a halftone mask comprises:
   forming the opaque conductive pattern and a light blocking layer by patterning the opaque conductive material based on the halftone mask; and
   forming the transparent conductive pattern and the transparent metal, layer by patterning the transparent conductive material based on the halftone mask.

17. The method of claim 16, wherein the light blocking layer is formed on the transparent metal layer to cover a portion of the planarization film.

18. The method of claim 11, wherein light emitted from the organic light emitting layer is emitted out via the substrate after passing through the first electrode, the insulating film, and the transparent metal layer.

19. The method of claim 11, wherein the bank layer is a non-transparent material.

20. The method of claim 11, wherein the total thickness of the first electrode and the transparent metal layer is 500 Å and the thickness of the insulating film is in the range of 500 Å and 4000 Å.

* * * * *